United States Patent
Meng et al.

(10) Patent No.: US 11,039,527 B2
(45) Date of Patent: Jun. 15, 2021

(54) AIR LEAK DETECTION IN PLASMA PROCESSING APPARATUS WITH SEPARATION GRID

(71) Applicants: Mattson Technology, Inc., Fremont, CA (US); Beijing E-Town Semiconductor Technology Co., Ltd., Beijing (CN)

(72) Inventors: Shuang Meng, Milpitas, CA (US); Xinliang Lu, Fremont, CA (US); Shawming Ma, Sunnyvale, CA (US); Hua Chung, Saratoga, CA (US)

(73) Assignees: MATTSON TECHNOLOGY, INC., Fremont, CA (US); BEIJING E-TOWN SEMICONDUCTOR TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/258,744

(22) Filed: Jan. 28, 2019

(65) Prior Publication Data
US 2020/0245444 A1    Jul. 30, 2020

(51) Int. Cl.
*H05H 1/00* (2006.01)
*G01N 21/00* (2006.01)
*H01J 37/32* (2006.01)

(52) U.S. Cl.
CPC ........... *H05H 1/0037* (2013.01); *G01N 21/00* (2013.01); *H01J 37/32449* (2013.01)

(58) Field of Classification Search
None
See application file for complete search history.

(56) References Cited

U.S. PATENT DOCUMENTS

| | | | |
|---|---|---|---|
| 6,769,288 B2 | 8/2004 | Ward et al. | |
| 6,975,393 B2 * | 12/2005 | Mettes | G01N 21/68 118/715 |
| 2008/0176149 A1 | 7/2008 | Grimbergen | |
| 2010/0018293 A1 | 1/2010 | Monkowski et al. | |
| 2014/0302680 A1 | 10/2014 | Singh et al. | |
| 2015/0004721 A1 | 1/2015 | Akimoto et al. | |

FOREIGN PATENT DOCUMENTS

WO    WO 2012-018375    2/2012

* cited by examiner

*Primary Examiner* — Ram N Kackar
(74) *Attorney, Agent, or Firm* — Dority & Manning, P.A.

(57) ABSTRACT

Plasma processing apparatus and associated methods for detecting air leak are provided. In one example implementation, the plasma processing apparatus can include a processing chamber to process a workpiece, a plasma chamber separated from the processing chamber by a separation grid, and an inductive coupling element to induce an oxygen plasma using a process gas in the plasma chamber. The plasma processing apparatus can detect afterglow emission strength from reaction between nitric oxide (NO) and oxygen radical(s) in a process space downstream to an oxygen plasma to measure nitrogen concentrations due to presence of air leak.

17 Claims, 9 Drawing Sheets

AIR LEAK DETECTION IN PLASMA PROCESSING APPARATUS WITH SEPARATION GRID

FIELD

The present disclosure relates generally to plasma processing using a plasma source.

BACKGROUND

Plasma processing tools can be used in the manufacture of devices such as integrated circuits, micromechanical devices, flat panel displays, and other devices. Plasma processing tools used in modern plasma etch and/or strip applications are required to provide a high plasma uniformity and a plurality of plasma controls, including independent plasma profile, plasma density, and ion energy controls. For instance, in some structures, plasma processing tools can conduct various plasma processes in a highly controlled environment, such as a sealed processing chamber. It can be important to avoid an introduction of impurities (e.g., air and/or water vapor) into the plasma processing tools, since any such impurity can have an adverse effect on one or more aspects of the plasma processes.

SUMMARY

Aspects and advantages of embodiments of the present disclosure will be set forth in part in the following description, or may be learned from the description, or may be learned through practice of the embodiments.

One example aspect of the present disclosure is directed to a method of detecting presence of nitrogen in a plasma processing apparatus. The method can include admitting an oxygen-containing gas into a plasma chamber. The method can include generating one or more species from the oxygen-containing gas in the plasma chamber. The method can include filtering the one or more species to create a mixture via a separation grid that separates the plasma chamber from a processing chamber. The mixture can include one or more oxygen radicals. The method can include obtaining data associated with luminescence in the processing chamber, wherein the luminescence is emitted from excited nitrogen dioxide molecules. The method can include determining the presence of nitrogen in the plasma processing apparatus based at least in part on the data associated with the luminescence.

Another example aspect of the present disclosure is directed to a plasma processing apparatus for detecting presence of nitrogen. The plasma processing apparatus can include a processing chamber having a workpiece support. The workpiece support can support a workpiece during plasma processing. The plasma processing apparatus can include a plasma chamber separated from the processing chamber by a separation grid. The plasma processing apparatus can include an inductive coupling element configured to induce a plasma using a process gas in the plasma chamber, the process gas comprising an oxygen-containing gas. The plasma processing apparatus can include a controller configured to obtain data associated with luminescence in the processing chamber. The luminescence can be emitted from excited nitrogen dioxide molecules. The controller can determine the presence of nitrogen in the plasma processing apparatus based at least in part on the data associated with the luminescence. The one or more oxygen radicals generated in the plasma can pass through the separation grid for exposure to the workpiece.

Other example aspects of the present disclosure are directed to systems, methods, and apparatus for air leak detection in plasma processing apparatus with separation grid.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
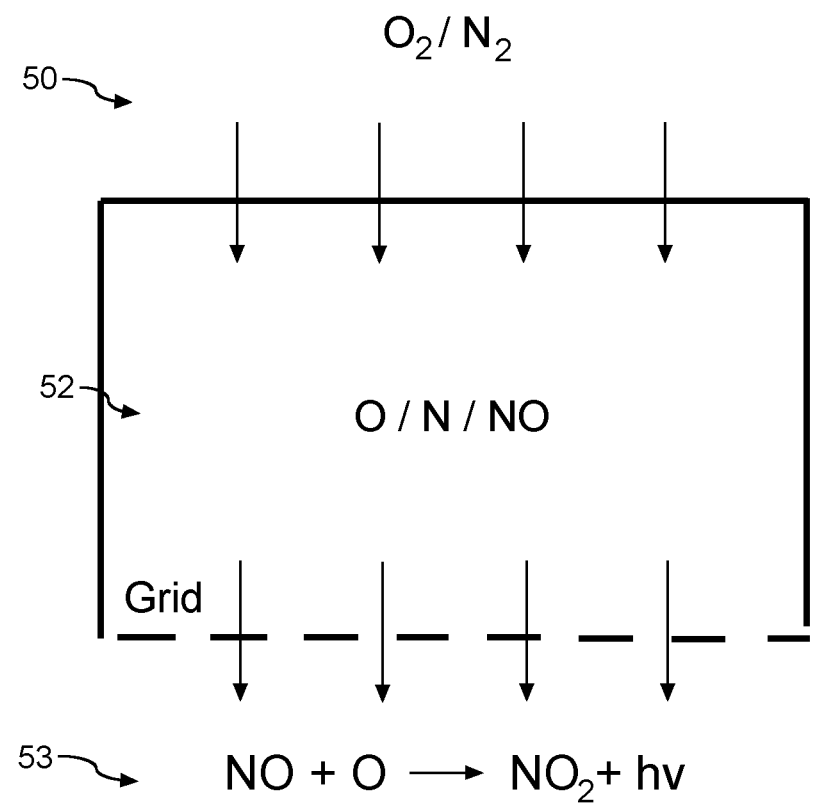
FIG. 1 depicts an example presence of nitrogen detection in a plasma processing apparatus.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to a plasma processing apparatus and associated methods for detecting air leak (e.g., presence of nitrogen) in the plasma processing apparatus. The plasma processing apparatus can include a processing chamber to process a workpiece (e.g., a substrate, a silicon wafer, a thin film, or any other suitable semiconductor material), a plasma chamber separated from the processing chamber by a separation grid, and an inductive coupling element to induce an oxygen plasma using a process gas (e.g., oxygen containing gas) in the plasma chamber. The plasma processing apparatus can detect afterglow (also referred to as luminescence) emission strength (also referred to as intensity) from reaction between nitric oxide (NO) and oxygen radical(s) in a process space downstream to an oxygen plasma (e.g., a space between a separation grid and the workpiece in the processing chamber, or a space proximate to a gas exhaust port for evacuating a gas from the processing chamber) to measure nitrogen concentrations due to presence of air leak.

In some instances, it can be desirable that detection (e.g., real-time monitoring/detection) of chamber leak rate in a downstream location of the plasma source during workpiece processing steps or in-situ dry clean steps without sacrificing workpiece throughput. It can be also desirable that the plasma processing apparatus can detect an air leak early (e.g., a low-level air leak detection) as the air leak occurs in a downstream location of the plasma source and can provide notification to a user and/or can stop workpiece processing based on the air leak detection.

According to example aspects of the present disclosure, an air leak detection (e.g., presence of nitrogen detection) can be built into an oxygen plasma step during workpiece processing or in-situ dry clean steps by detecting luminescence strength in a process space between a separation grid and the workpiece and/or proximate to a gas exhaust port for evacuating a gas from the processing chamber. The luminescence can be generated by reactions between nitric oxide and oxygen radical(s) downstream to the oxygen plasma. This luminescence can be an indicator of presence of nitrogen in a plasma region (e.g., in a plasma chamber) and/or in a downstream region (e.g., in a processing chamber), and a nitrogen concentration of the nitrogen can be determined by comparing the luminescence strength with a model (e.g., a calibration curve) correlating the nitrogen concentration with the luminescence strength. The model can be obtained from multiple optical emission spectra, and each of the optical emission spectra can be associated with a known nitrogen concentration. A measured nitrogen concentration can then be converted to an equivalent chamber leak rate.

In some embodiments, an optical emission spectroscopy (OES) probe can be connected to an optical view port on a processing chamber downstream to a plasma source. The OES probe can detect luminescence from a location in the processing chamber separated from the plasma source with a separation grid such that the plasma source can ignite a plasma contained above the separation grid in a plasma chamber, and only active radicals and neutrals can flow into the processing chamber. For instance, the OES probe can detect luminescence from a location between the separation grid and a workpiece or a workpiece support in the processing chamber, and/or from a location proximate to a gas exhaust port for evacuating a gas from the processing chamber.

In some embodiments, nitrogen can react with oxygen radicals to form nitric oxide (NO). The nitric oxide downstream to the plasma in the processing chamber can recombine with oxygen radicals to form excited states of nitrogen dioxide ($NO_2$) that can then emit luminescence photons to decay to ground state. Luminescence from such reaction between nitric oxide and oxygen radicals can form a greenyellow luminescence in the processing chamber, and the OES probe can capture data associated with the luminescence. In some embodiments, the data associated with the luminescence can include an optical emission spectrum (e.g., an optical continuum spectrum) having wavelengths in a range of about 400 nanometers to about 1400 nanometers with a maximum emission at about 615 nanometers. It can be determined that the data associated with the luminescence (e.g., an intensity of the luminescence) is linearly related to a nitrogen concentration in an oxygen ambient. Therefore, the data associated with the luminescence can be used to accurately measure nitrogen concentration in the processing chamber.

In some embodiments, to quantitively determine a nitrogen concentration from a luminescence, a calibration procedure can be performed with controlled nitrogen doping. Measured luminescence emission strengths as a function of nitrogen concentrations under controlled doping can be extrapolated to obtain a model (e.g., a calibration curve). Luminescence intensity from measurement can then be compared with the model to determine a corresponding nitrogen concentration in the processing chamber. A data processing algorithm can be implemented to increase the signal-to-noise ratio such that accuracy of nitrogen concentration detection can be improved. As such, a very low nitrogen concentration can be accurately determined, even though luminescence intensity in an optical emission spectrum captured by an OES probe can be weak and noisy.

In some embodiments, the plasma processing apparatus can include a controller to obtain data associated with luminescence in the processing chamber. The controller can further determine the presence of nitrogen in the plasma processing apparatus based on the data associated with the luminescence.

For instance, in some embodiments, for each time point of multiple time points during a time period (e.g., a number of runs), the controller can determine a background by averaging intensities of a first portion of the data associated with the luminescence (e.g., an optical emission spectrum). For instance, the controller can average OES intensities corresponding to wavelengths in a range of about 200 nanometers to about 350 nanometers to obtain a background. The controller can subtract the background from a second portion of the optical emission spectrum. For instance, the controller can subtract the background from OES intensities corresponding to wavelengths in a range of about 400 nanometers to about 750 nanometers. The controller can integrate the subtracted second portion of the optical emission spectrum to obtain an integrated intensity at that time point. For instance, the controller can integrate subtracted OES intensities corresponding to wavelengths in a range of about 400 nanometers and 750 nanometers to obtain a signal. The controller can average multiple integrated intensities obtained during the time period to obtain a time-averaged integrated intensity. Each of multiple integrated intensities can be associated with each time point. For instance, the controller can average the integrated OES signals over a number of runs to obtain a time-averaged integrated OES signal. The controller can compare the time-averaged integrated intensity with a model correlating nitrogen concentration with time-averaged integrated intensity to determine the nitrogen concentration. For instance, the controller can compare the time-average integrated OES signal with a calibration curve to determine the nitrogen concentration.

In some embodiments, the OES probe can be replaced with a single-wavelength end-point detector if a detected wavelength is within luminescence continuum spectrum. For instance, the single-wavelength end-point detector can detect luminescence at about peak wavelength (e.g., about 615 nanometers) of the spectrum. In some embodiments, the OES probe can be replaced with a multi-wavelength end point detector (e.g., photodiode) to detect a broadband luminescence intensity instead of a full optical spectrum obtained from the OES probe.

In some embodiments, the plasma processing apparatus and associated methods according to example aspects of the present disclosure can provide a number of technical effects and benefits. For instance, the plasma processing apparatus and associated methods can provide a feasibility to perform tracking (e.g., real-time tracking) of chamber leak rate in a process space during workpiece processing or in-situ dry clean steps in a downstream plasma processing apparatus with a charge separating grid without any additional process steps, therefore, the plasma processing apparatus and associated methods cannot sacrifice of workpiece throughput. Additionally, detector can be various such as an OES probe, an end-point detector, or a photodiode facing the process space between a separation grid and a workpiece pedestal, and/or proximate to a gas exhaust port for evacuating a gas from the processing chamber.

Aspects of the present disclosure are discussed with reference to a "workpiece" that is a "semiconductor wafer" for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

FIG. 1 depicts an example presence of nitrogen detection in a plasma processing apparatus according to example embodiments of the present disclosure. A gas inlet 50 delivers oxygen ($O_2$) containing gas into a plasma chamber 52 (e.g., an inductively coupled plasma chamber) to generate one or more species. The gas inlet 50 can have an air leak (e.g., containing nitrogen gas $N_2$). The nitrogen gas can react with oxygen radicals in the plasma chamber 52 to form nitric oxide (NO). The nitric oxide (NO) and oxygen radicals can pass through a separation grid separating the plasma chamber 52 from a processing chamber 53 into the processing chamber 53. The nitric oxide (NO) can react with oxygen radicals in the processing chamber 53 to form excited nitrogen dioxide ($NO_2$) that emits luminescence in the processing chamber 53 in a process space between the separation grid and a workpiece pedestal.

Figure 2:
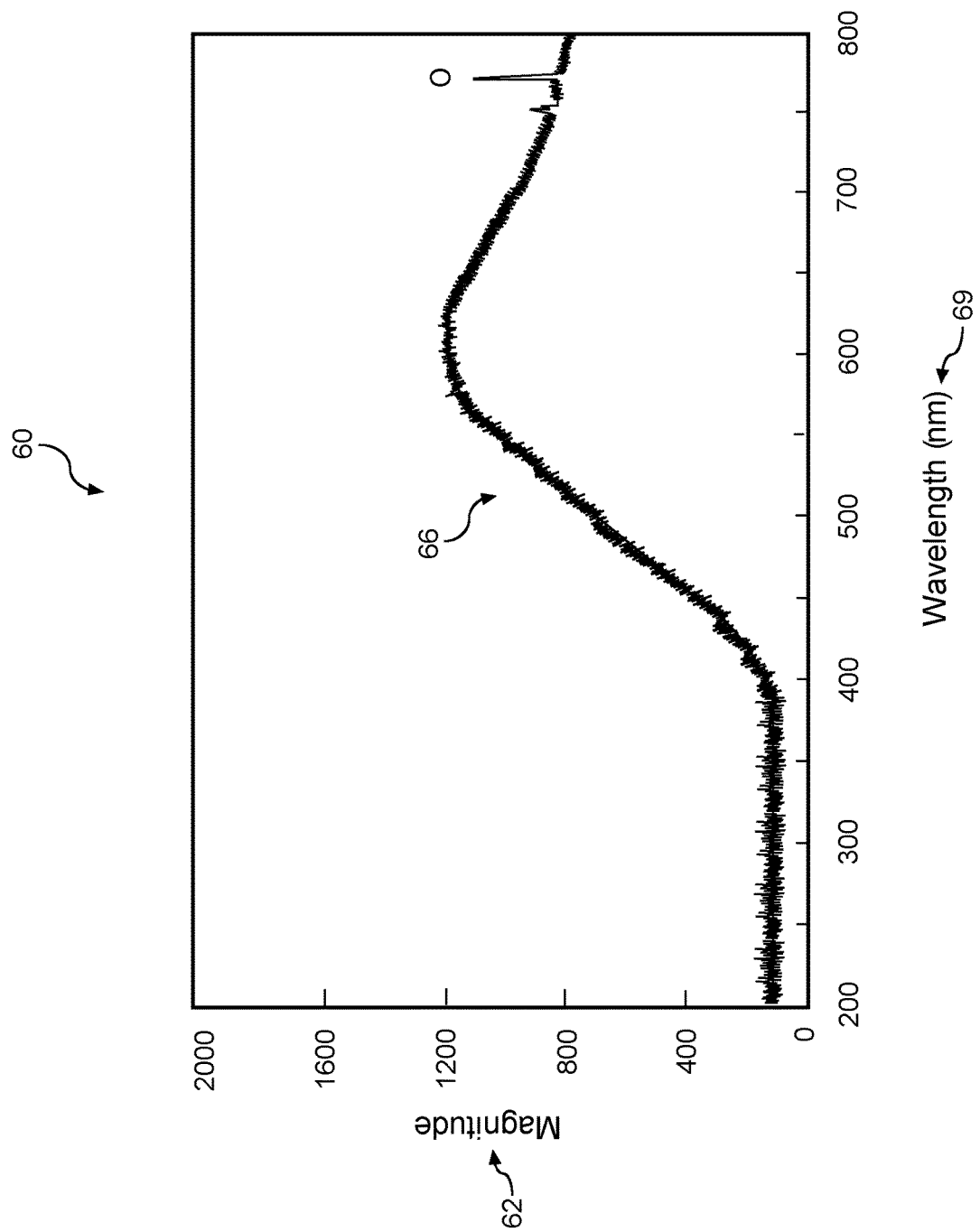
FIG. 2 depicts an example optical emission spectrum associated with presence of nitrogen detection.

FIG. 2 depicts an example optical emission spectrum 60 associated with presence of nitrogen detection according to example embodiments of the present disclosure. A luminescence continuum spectrum 66 can be obtained from an optical emission spectroscopy probe. The luminescence continuum spectrum 66 is plotted in a wavelength axis 69 and magnitude axis 62. The luminescence continuum spectrum 66 includes wavelengths in a range of about 200 nanometers to about 800 nanometers with a peak wavelength at about 615 nanometers.

Figure 3:
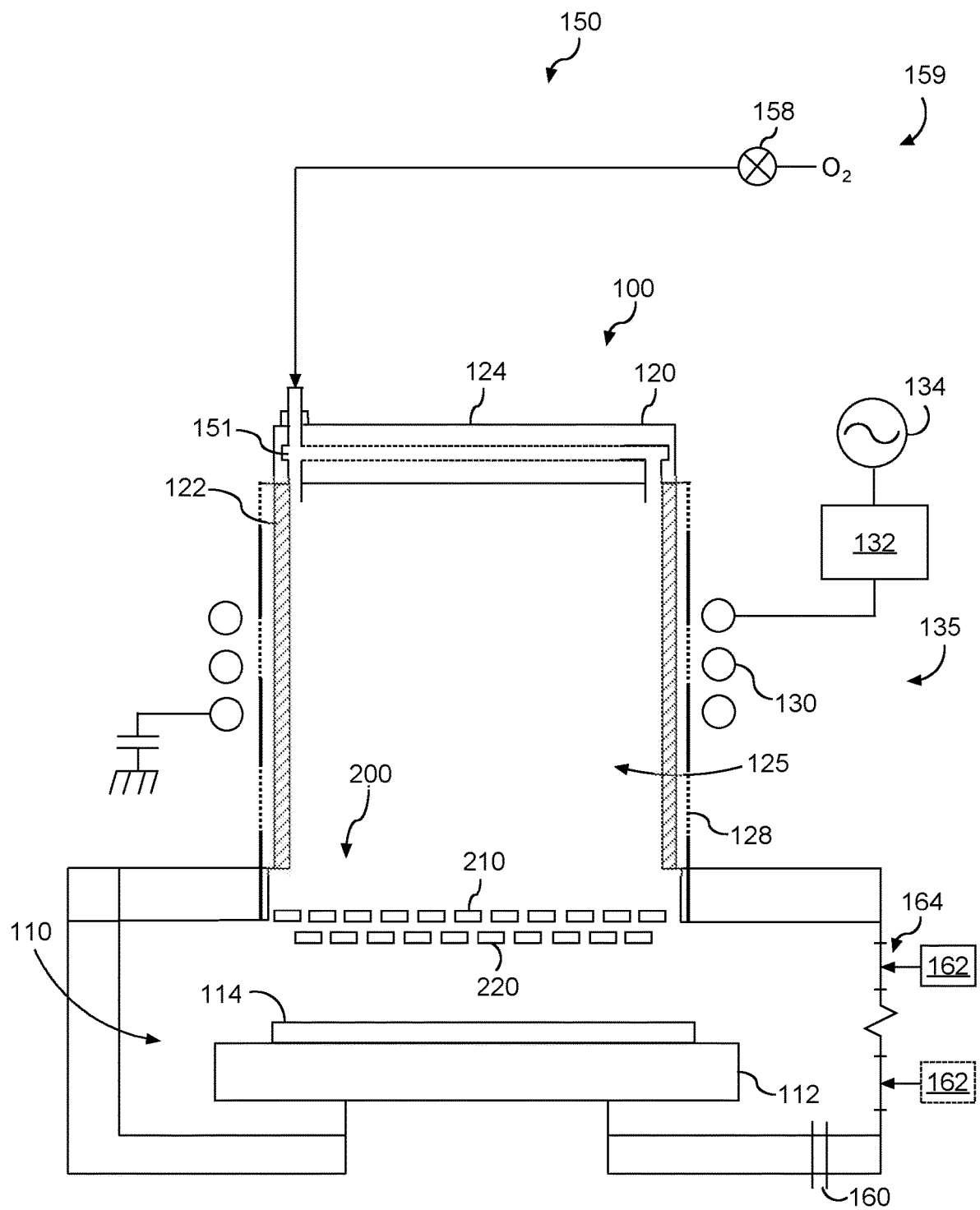
FIG. 3 depicts an example plasma processing apparatus process according to example embodiments of the present disclosure.

FIG. 3 depicts an example plasma processing apparatus 100 according to example embodiments of the present disclosure. As illustrated, the plasma processing apparatus 100 includes a processing chamber 110 (e.g., one embodiment of a processing chamber 53 in FIG. 1) and a plasma chamber 120 (e.g., one embodiment of a plasma chamber 52 in FIG. 1) that is separated from the processing chamber 110. The processing chamber 110 includes a workpiece support or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. The dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an oxygen containing gas) can be provided to the chamber interior from a gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 3, a separation grid 200 separates the plasma chamber 120 from the processing chamber 110. The separation grid 200 can be used to perform ion filtering from a mixture generated by plasma in the plasma chamber 120 to generate a filtered mixture (e.g., oxygen radicals). The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 3, the apparatus 100 can include a gas delivery system 150 configured to deliver process gas to the plasma chamber 120, for instance, via gas distribution channel 151 or other distribution system (e.g., showerhead).

The gas delivery system can include a feed gas line(s) 159. The feed gas line(s) 159 can be controlled using valves and/or mass flow controllers to deliver a desired amount of gases into the plasma chamber as process gas. As shown in FIG. 3, the gas delivery system 150 can include feed gas line(s) for delivery of an oxygen containing gas. A control valve and/or mass flow controller 158 can be used to control a flow rate of the feed gas line to flow a process gas into the plasma chamber 120.

As shown in FIG. 3, according to example aspects of the present disclosure, a detection unit 162 (e.g., an optical emission spectroscopy (OES) probe, a single-wavelength end-point detector, or a multi-wavelength end point detector) can be connected to an optical view port 164 to detect luminescence in a process space between the separation grid 210 and the workpiece 114 in the processing chamber 110, and/or in a process space proximate to a gas exhaust port 160 for evacuating a gas from the processing chamber 110 to measure nitrogen concentrations due to presence of air leak.

Figure 4:
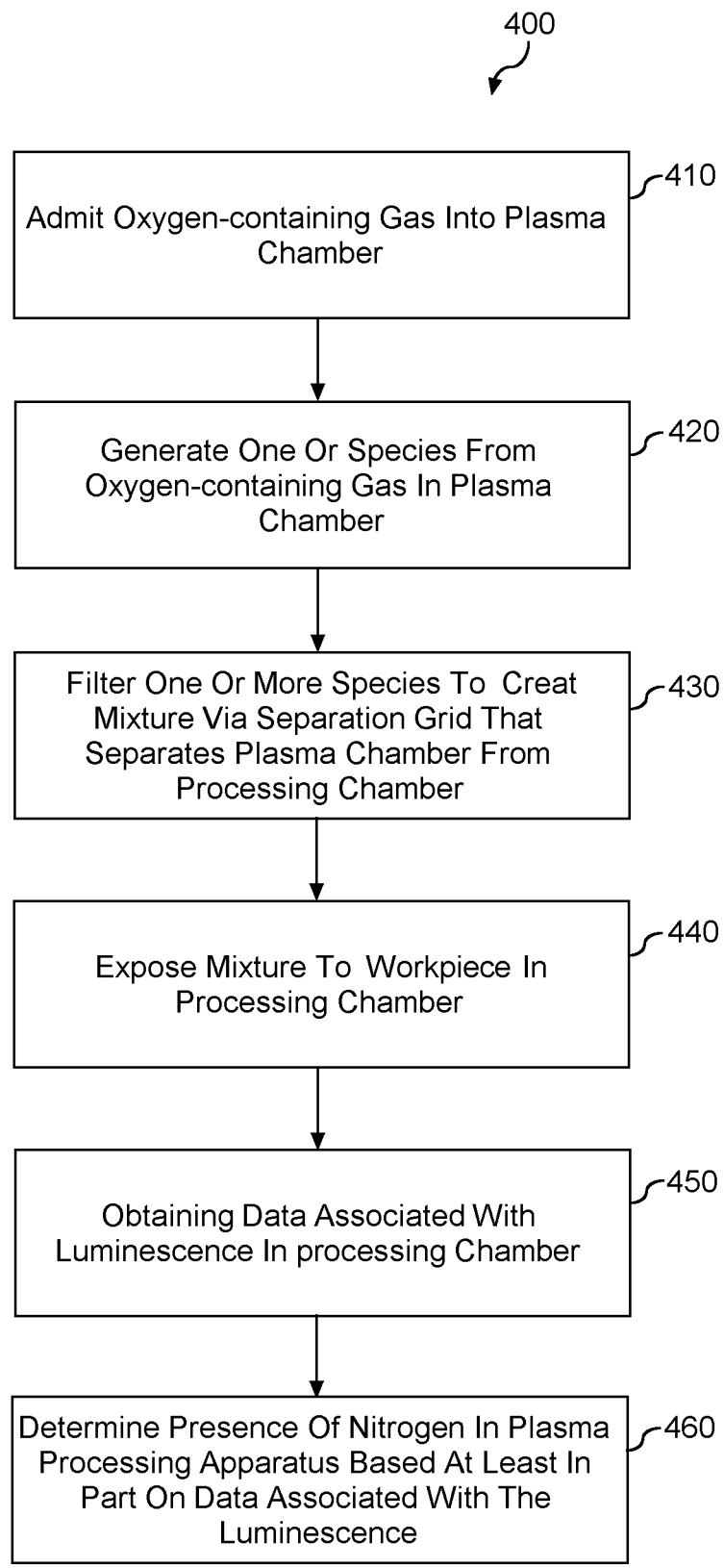
FIG. 4 depicts a flow diagram of an example process according to example embodiments of the present disclosure.

FIG. 4 depicts a flow diagram of an example method (400) according to example embodiments of the present disclosure. The method (400) will be discussed with reference to the plasma processing apparatus 100 of FIG. 3 by way of example. The method (400) can be implemented in any suitable plasma processing apparatus. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (410), the method can include admitting an oxygen-containing gas into a plasma chamber. For instance, a gas delivery system 150 of a plasma processing apparatus 100 can deliver oxygen-containing gas into a plasma chamber 120.

At (420), the method can include generating one or more species from the oxygen-containing gas in the plasma chamber. For instance, one or more species from the oxygen-containing gas can be generated in the plasma chamber 120.

At (430), the method can include filtering the one or more species to create a mixture (e.g., oxygen radicals) via a separation grid that separates the plasma chamber from a processing chamber. For instance, a separation grid 200 can filter one or more species to create oxygen radicals.

At (440), the method can include exposing the mixture to a workpiece in the processing chamber. For instance, a workpiece 114 can be exposed to oxygen radicals in the processing chamber 110.

In some embodiments, the method of detecting presence of nitrogen in a plasma processing apparatus can be implemented during a process (e.g., in-situ dry clean steps) without a workpiece in the processing chamber.

At (450), the method can include obtaining data associated with luminescence in the processing chamber. For instance, the nitrogen can react with oxygen radicals to form nitric oxide (NO). The nitric oxide in the processing chamber 110 can recombine with oxygen radicals to form excited states of nitrogen dioxide ($NO_2$) that can then emit luminescence photons to decay to ground state. Luminescence from such reaction between nitric oxide and oxygen radicals can form a green-yellow luminescence in the processing chamber, and the OES probe can capture data associated with the luminescence. Another example is described above in FIG. 1.

At (460), the method can include determining the presence of nitrogen in the plasma processing apparatus based at least in part on the data associated with the luminescence. In some embodiments, for each time point of multiple time points during a time period (e.g., a number of runs), the method can include determining a background by averaging intensities of a first portion of the data associated with the luminescence (e.g., an optical emission spectrum). For instance, the method can include averaging OES intensities corresponding to wavelengths in a range of about 200 nanometers to about 350 nanometers to obtain a background. The method can include subtracting the background from a second portion of the optical emission spectrum. For instance, the method can include subtracting the background from OES intensities corresponding to wavelengths in a range of about 400 nanometers to about 750 nanometers. The method can include integrating the subtracted second portion of the optical emission spectrum to obtain an integrated intensity at that time point. For instance, the method can include integrating subtracted OES intensities corresponding to wavelengths in a range of about 400 nanometers and 750 nanometers to obtain a signal. The method can include averaging multiple integrated intensities obtained during the time period to obtain a time-averaged integrated intensity. Each of multiple integrated intensities can be associated with each time point. For instance, the method can include averaging the integrated OES signals over a number of runs to obtain a time-averaged integrated OES signal. The method can include comparing the time-averaged integrated intensity with a model correlating nitrogen concentration with time-averaged integrated intensity to determine the nitrogen concentration. For instance, the method can include comparing the time-average integrated OES signal with a calibration curve to determine the nitrogen concentration.

Figure 5:
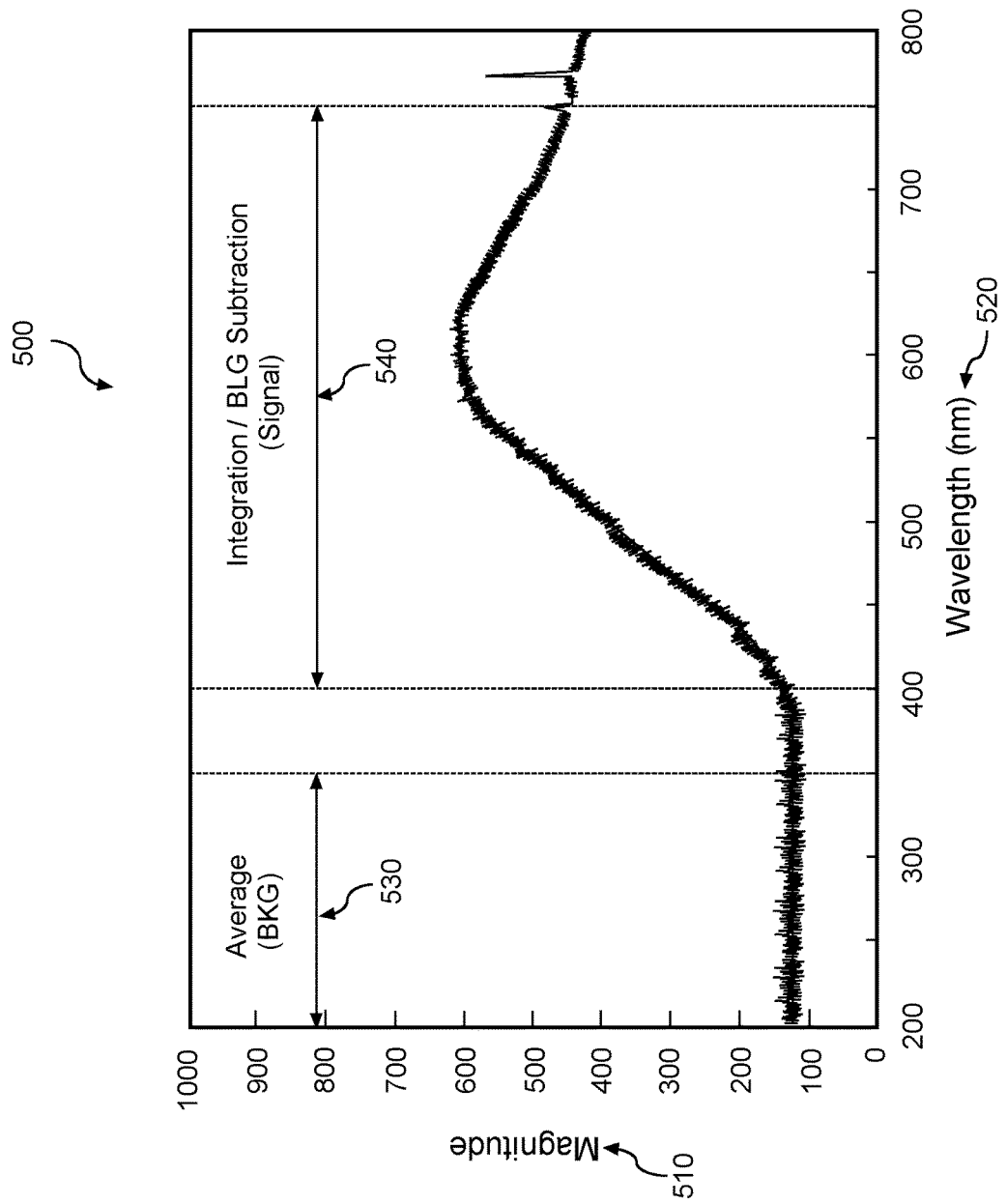
FIG. 5 depicts an example optical emission spectrum for data processing according to example embodiments of the present disclosure.

FIG. 5 depicts an example optical emission spectrum 500 for data processing according to example embodiments of the present disclosure. The optical emission spectrum 500 is plotted in a magnitude axis 510 and a wavelength axis 520. The optical emission spectrum 500 has a first portion 530 corresponding to wavelengths in a range of about 200 nanometers to about 350 nanometers, and a second portion 540 corresponding to wavelengths in a range of about 400 nanometers to about 750 nanometers. Intensities of the first portion 530 can be averaged to obtain a background. The background can be subtracted from the second portion, and the subtracted second portion can be integrated to obtain a signal.

Figure 6:
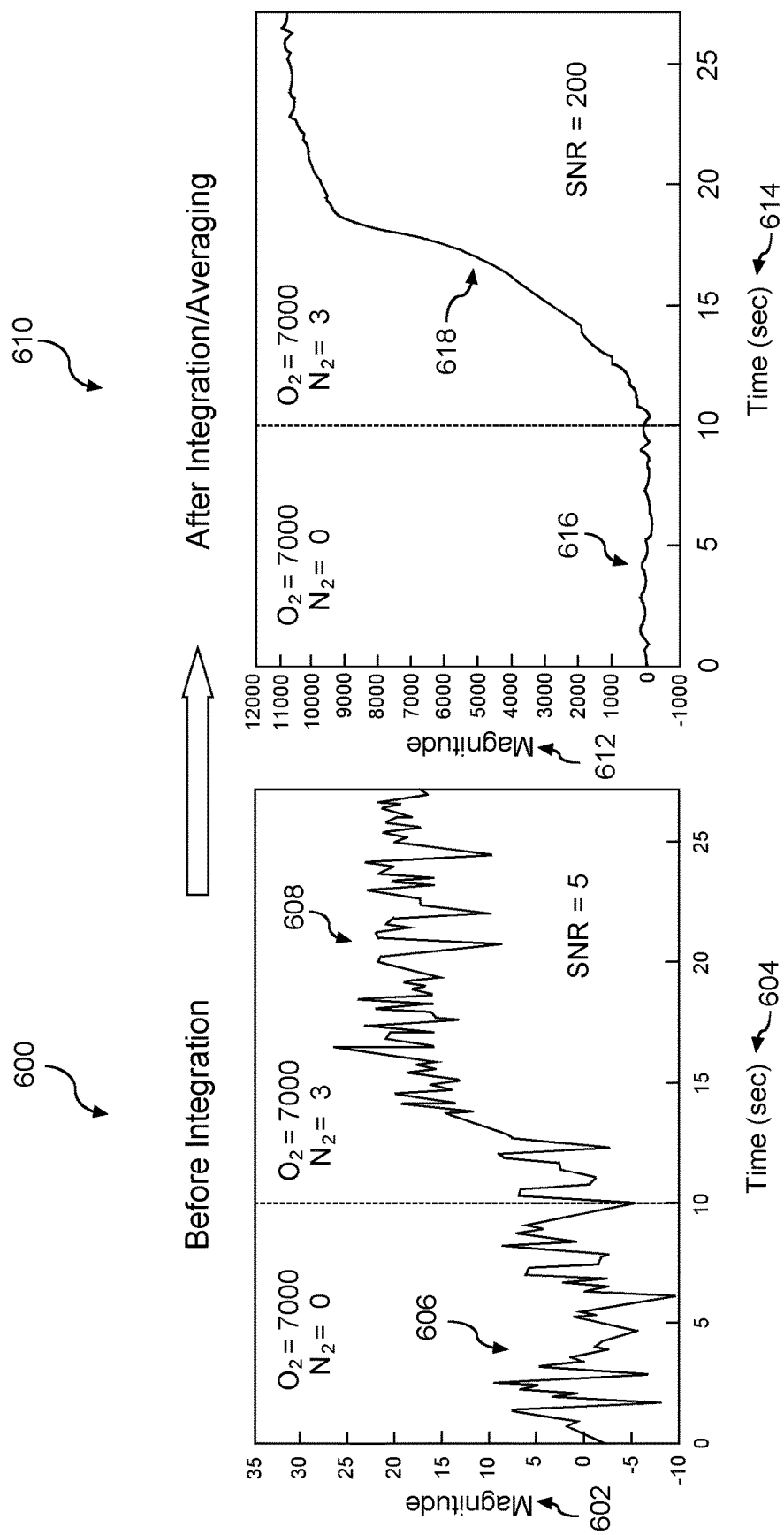
FIG. 6 depicts an example comparison of data processing before and after integration of optical emission spectra according to example embodiments of the present disclosure.

FIG. 6 depicts an example comparison of data processing before and after integration of optical emission spectra according to example embodiments of the present disclosure. Signals before and after integration are plotted in a magnitude axis and a time axis. Each signal at a time point can be obtained from an optical emission spectrum (e.g., a spectrum shown in FIG. 2 and FIG. 5). Signals before integration are plotted in a magnitude axis 602 and a time axis 604. Each signal in plot 600 at a time point can be an intensity corresponding to a peak wavelength of an optical emission spectrum. A first portion 606 shows signals obtained from a condition having oxygen gas at 7000 sccm and nitrogen gas at 0 sccm, and a second portion 609 shows signals obtained from a condition having oxygen gas at 7000 sccm and nitrogen gas at 3 sccm. Signals after integration are plotted in a magnitude axis 612 and a time axis 614. A first portion 616 shows signals obtained from a condition having oxygen gas at 7000 sccm and nitrogen gas at 0 sccm. For each signal at a time point in the first portion 616 corresponding to a first time period in a range of about 0 second to about 10 seconds, a portion of an optical emission spectrum (e.g., a second portion 540 of an optical emission spectrum 500 in FIG. 5) can be integrated to obtain an integrated intensity at that time point. The integrated intensities during that time period can be averaged to obtain a time-averaged integrated intensity. A second portion 618 shows signals obtained from a condition having oxygen gas at 7000 sccm and nitrogen gas at 3 sccm. For each signal at a time point in the second portion 618 corresponding to a second time period in a range of about 10 seconds to about 30 seconds, a portion of an optical emission spectrum (e.g., a second portion 540 of an optical emission spectrum 500 in FIG. 5) can be integrated to obtain an integrated intensity at that time point. The integrated intensities during that time period can be averaged to obtain a time-averaged integrated intensity.

Figure 7:
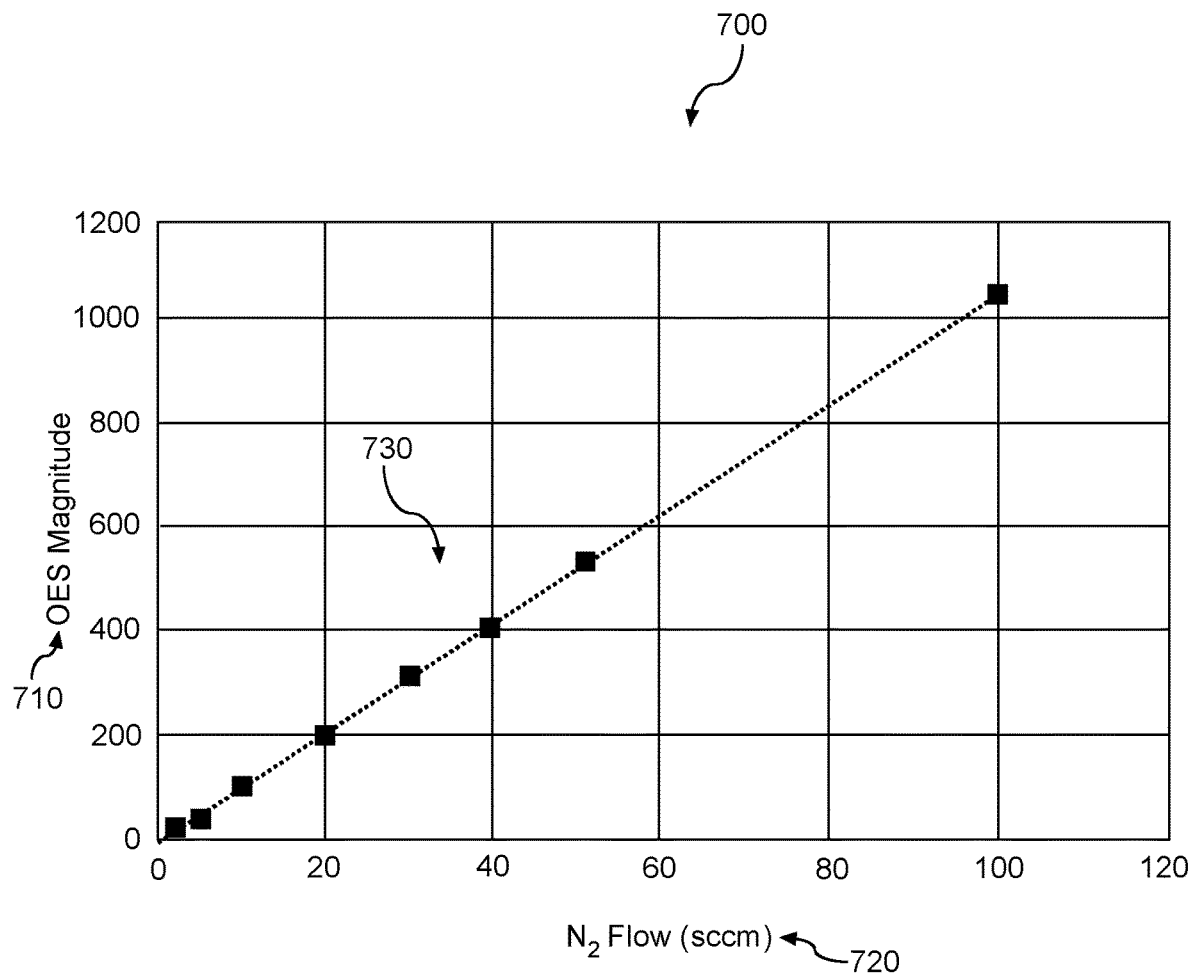
FIG. 7 depicts an example model correlating nitrogen concentrations with time-averaged integrated intensities according to example embodiments of the present disclosure.

FIG. 7 depicts an example model 700 correlating nitrogen concentrations with time-averaged integrated intensities according to example embodiments of the present disclosure. A calibration curve 730 is plotted in an OES magnitude axis 710 and a nitrogen flow axis 720. The calibration curve 730 shows a linear relationship between known nitrogen flow rates (e.g., controlled nitrogen doping) and time-averaged integrated intensities around about an afterglow wavelength (e.g., about 600 nanometers). FIG. 7 shows a broad range of nitrogen concentrations with nitrogen flow rates from about 0 sccm to more than about 100 sccm. Based on measured integrated intensities from lowest level to highest level, eight nitrogen flows are determined.

Figure 8:
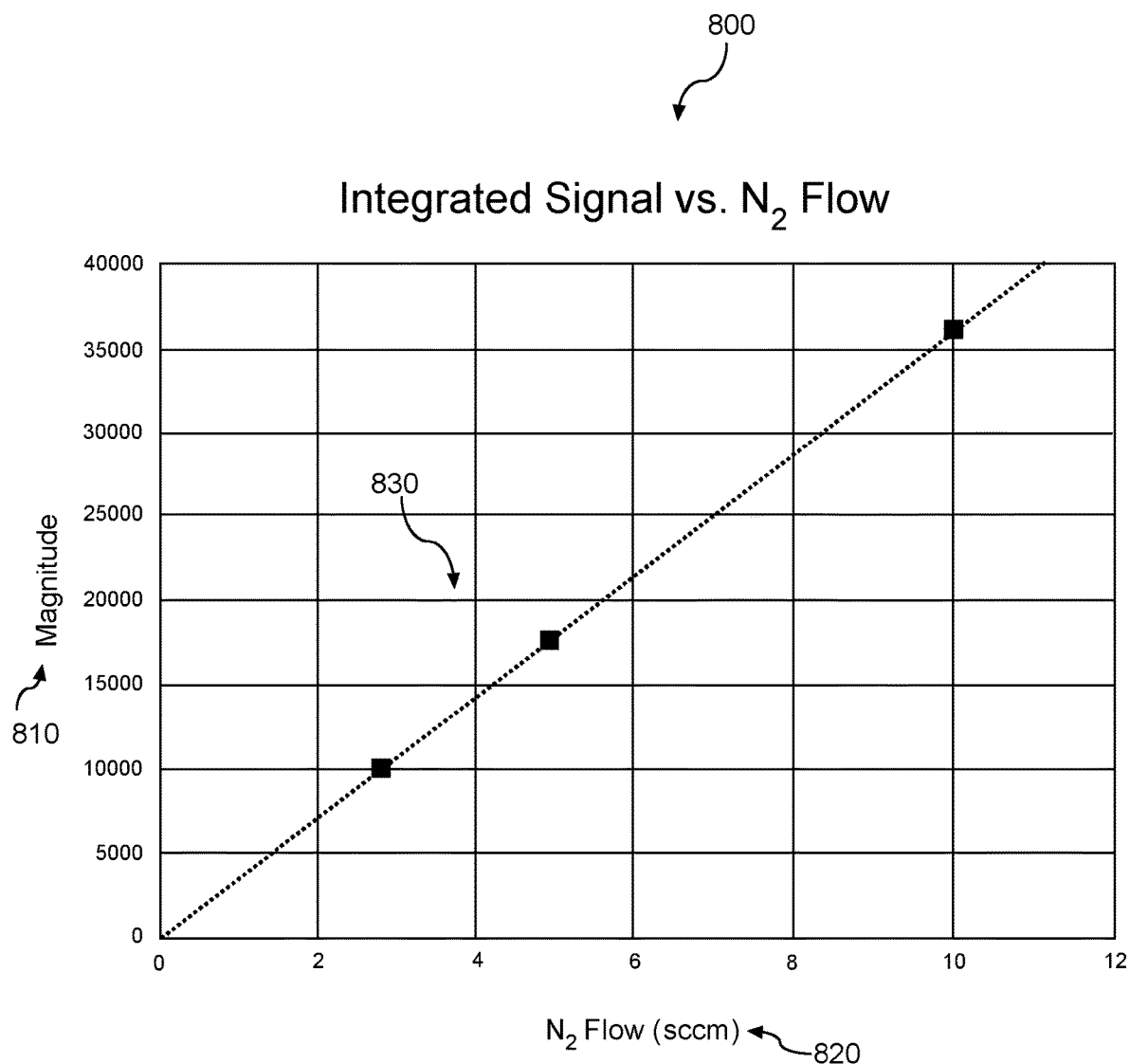
FIG. 8 depicts an example model correlating nitrogen concentrations with time-averaged integrated intensities according to example embodiments of the present disclosure.

FIG. 8 depicts an example model 800 correlating nitrogen concentrations with time-averaged integrated intensities according to example embodiments of the present disclosure. A calibration curve 830 is plotted in an OES magnitude axis 810 and a nitrogen flow axis 820. The calibration curve 830 shows a linear relationship between known nitrogen flow rates (e.g., controlled nitrogen doping) and time-averaged integrated intensities. FIG. 8 shows a broad range of nitrogen concentrations with nitrogen flow rates from about 0 sccm to more than about 12 sccm. Based on measured integrated intensities, three nitrogen flows are determined.

Figure 9:
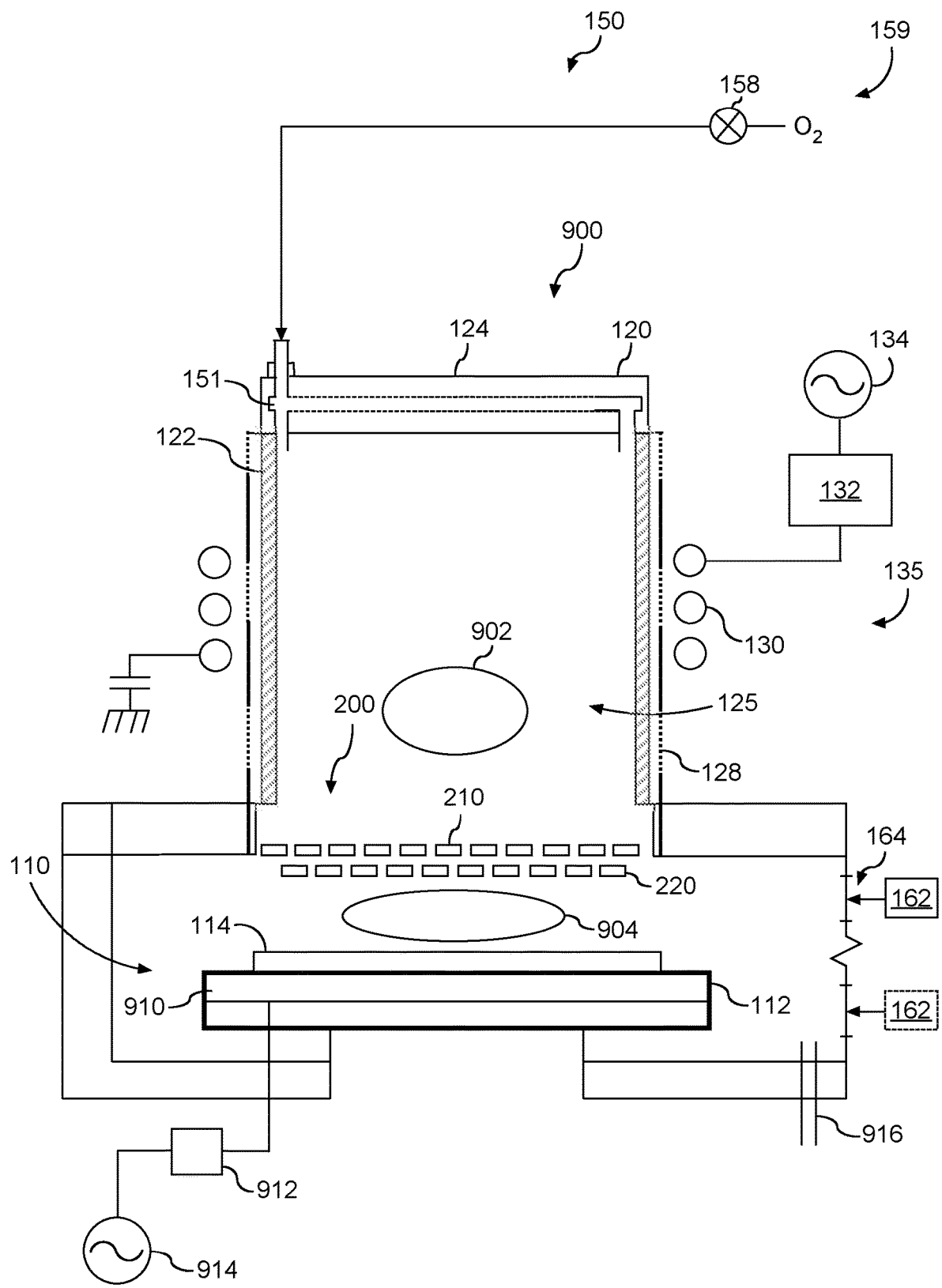
FIG. 9 depicts an example plasma processing apparatus according to example embodiments of the present disclosure.

FIG. 9 depicts an example plasma processing apparatus 900 that can be used to implement processes according to example embodiments of the present disclosure. The plasma processing apparatus 900 is similar to the plasma processing apparatus 100 of FIG. 3.

More particularly, plasma processing apparatus 900 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 9, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 900 of FIG. 9 is operable to generate a first plasma 902 (e.g., a remote plasma) in the plasma chamber 120 and a second plasma 904 (e.g., a direct plasma) in the processing chamber 110. The first plasma 902 can be generated by an inductively coupled plasma source. The second plasma 904 can be generated by, for instance, a capacitively coupled plasma source (e.g., bias). As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 900 of FIG. 9 includes a bias source having bias electrode 910 in the pedestal 112. The bias electrode 910 can be coupled to an RF power generator 914 via a suitable matching network 912. When the bias electrode 910 is energized with RF energy, a second plasma 904 can be generated from a mixture in the processing chamber 110 for direct exposure to the workpiece 114. The processing chamber 110 can include a gas exhaust port 916 for evacuating a gas from the processing chamber 110.

As shown in FIG. 9, the apparatus 100 can include a gas delivery system 150 configured to deliver process gas to the plasma chamber 120, for instance, via gas distribution channel 151 or other distribution system (e.g., showerhead). The gas delivery system can include a feed gas line(s) 159. The feed gas line(s) 159 can be controlled using valves and/or mass flow controllers to deliver a desired amount of gases into the plasma chamber as process gas. As shown in FIG. 9, the gas delivery system 150 can include a feed gas line for delivery of oxygen-containing gas. A control valve and/or mass flow controller 158 can be used to control a flow rate of each feed gas line to flow a process gas into the plasma chamber 120.

As shown in FIG. 9, according to example aspects of the present disclosure, a detection unit 162 (e.g., an optical emission spectroscopy (OES) probe, a single-wavelength end-point detector, or a multi-wavelength end-point detector) can be connected to an optical view port 164 to detect luminescence in a process space between the separation grid 210 and the workpiece 114 in the processing chamber 110, and/or in a process space proximate to a gas exhaust port 160 for evacuating a gas from the processing chamber 110 to measure nitrogen concentrations due to presence of air leak.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method of detecting presence of nitrogen in a plasma processing apparatus, the method comprising:
    admitting an oxygen-containing gas into a plasma chamber;
    generating one or more species from the oxygen-containing gas in the plasma chamber, the one or more species comprising an oxygen plasma;
    filtering the one or more species to create a mixture via a separation grid that separates the plasma chamber from a processing chamber located downstream of the plasma chamber, the mixture comprising one or more oxygen radicals, wherein the oxygen plasma is contained in the plasma chamber such that the mixture in the processing chamber is separated from the oxygen plasma via the separation grid;
    obtaining data associated with luminescence generated in the processing chamber, wherein the luminescence is emitted from excited nitrogen dioxide molecules located downstream from the oxygen plasma; and
    determining the presence of nitrogen in the plasma processing apparatus based at least in part on the data associated with the luminescence corresponding to a peak wavelength of 600-615 nanometers.

2. The method of claim 1, wherein the excited nitrogen dioxide molecules are generated by reaction of nitric oxide recombining with the one or more oxygen radicals in the processing chamber.

3. The method of claim 2, wherein the nitric oxide is generated by one or more nitrogen molecules reacting with the one or more oxygen radicals.

4. The method of claim 1, wherein determining the presence of nitrogen comprises determining a concentration of nitrogen in the plasma processing apparatus.

5. The method of claim 1, wherein the nitrogen is in the plasma chamber.

6. The method of claim 1, wherein the nitrogen is in the processing chamber.

7. The method of claim 1, wherein the data associated with the luminescence is obtained from a location between the separation grid and a workpiece support in the processing chamber.

8. The method of claim 1, wherein the data associated with the luminescence is obtained from a location proximate to a gas exhaust port for evacuating a gas from the processing chamber.

9. The method of claim 1, wherein the data associated with the luminescence is obtained from an optical emission spectroscopy (OES) probe that is connected to an optical view port on the processing chamber.

10. The method of claim 1, wherein the data associated with the luminescence comprises an optical emission spectrum comprising wavelengths in a range of about 400 nanometers to about 1400 nanometers.

11. The method of claim 1, wherein the data associated with the luminescence comprises optical emission data obtained from a multi-wavelength end point detector.

12. The method of claim 1, wherein the data associated with the luminescence comprises optical emission data obtained from a single-wavelength end point detector.

13. The method of claim 1, further comprising exposing the mixture to a workpiece.

14. The method of claim 4, wherein determining the concentration of nitrogen in the plasma processing apparatus comprises:
    for each time point of a plurality of time points during a time period,
        determining a background by averaging intensities of a first portion of the data associated with the luminescence, wherein the data associated with the luminescence comprises an optical emission spectrum;
        subtracting the background from a second portion of the optical emission spectrum, wherein the second portion comprises higher wavelengths than the first portion;
        integrating subtracted second portion of the optical emission spectrum to obtain an integrated intensity at that time point;
    averaging a plurality of integrated intensities obtained during the time period to obtain a time-averaged integrated intensity, each of the plurality of integrated intensities associated with each time point; and
    comparing the time-averaged integrated intensity with a model correlating nitrogen concentration with time-averaged integrated intensity to determine the nitrogen concentration.

15. The method of claim 14, wherein the first portion of the optical emission spectrum comprises wavelengths is in a range of about 200 nanometers to about 350 nanometers.

16. The method of claim 14, wherein the second portion of the optical emission spectrum comprises wavelengths in a range of about 400 nanometers to about 750 nanometers.

17. The method of claim 14, wherein the model is obtained from a plurality of optical emission spectra, each of the plurality of optical emission spectra associated with a known nitrogen concentration.

\* \* \* \* \*